(12) United States Patent
Stewart

(10) Patent No.: US 6,737,224 B2
(45) Date of Patent: May 18, 2004

(54) METHOD OF PREPARING THIN SUPPORTED FILMS BY VACUUM DEPOSITION

(76) Inventor: Jeffrey Stewart, 690-D Avenida Sevilla, Laguna Hills, CA (US) 92653

(*) Notice: Subject to any disclaimer, the term of this patent is extended or adjusted under 35 U.S.C. 154(b) by 0 days.

(21) Appl. No.: 09/836,794

(22) Filed: Apr. 17, 2001

(65) Prior Publication Data

US 2002/0150843 A1 Oct. 17, 2002

(51) Int. Cl.⁷ ............................. G03F 7/00; H01L 21/00
(52) U.S. Cl. ...................... 430/322; 430/311; 430/312; 430/313; 430/323; 430/324; 216/59; 106/122
(58) Field of Search ................. 430/311–313, 322–324, 430/327, 329; 216/59, 14, 37, 56, 100; 428/138; 118/504, 719, 720

(56) References Cited

U.S. PATENT DOCUMENTS

| | | | |
|---|---|---|---|
| 3,288,728 A | 11/1966 | Gorham | 260/2 |
| 3,300,332 A | 1/1967 | Gorham et al. | 117/100 |
| 3,342,754 A | 9/1967 | Gorham et al. | 260/2 |
| 3,385,953 A | 5/1968 | Henneberger | 219/390 |
| 3,472,795 A | 10/1969 | Tittmann et al. | 260/2 |
| 3,503,903 A | 3/1970 | Shaw et al. | 260/2 |
| 3,600,216 A | 8/1971 | Stewart | 117/72 |
| 3,712,074 A | 1/1973 | Boissin | 62/555 |
| 3,719,166 A | 3/1973 | Gereth | 117/161 |
| 3,753,773 A | 8/1973 | Lee | 427/248 |
| 3,895,135 A | 7/1975 | Hofer | 427/216 |
| 3,908,046 A | 9/1975 | Fitzpatrick et al. | 118/718 |
| 3,908,075 A * | 9/1975 | Jackson et al. | 428/133 |
| 4,508,054 A | 4/1985 | Baumberger et al. | 118/719 |
| 4,592,306 A | 6/1986 | Gallego | 118/719 |
| 4,649,859 A | 3/1987 | Wanlass | 118/715 |
| 4,683,143 A | 7/1987 | Riley | 427/8 |
| 4,760,244 A | 7/1988 | Hokynar | 219/390 |
| 4,825,808 A | 5/1989 | Takahashi et al. | 118/719 |
| 4,852,516 A | 8/1989 | Rubin et al. | 118/715 |
| 4,945,856 A | 8/1990 | Stewart | 118/715 |
| 4,990,372 A | 2/1991 | Sunder et al. | 427/237 |
| 5,030,810 A | 7/1991 | Haley et al. | 219/385 |

(List continued on next page.)

FOREIGN PATENT DOCUMENTS

| | | |
|---|---|---|
| JP | 53-11576 | 2/1978 |
| JP | 58-166726 | 10/1983 |
| JP | 59-74629 | 4/1984 |
| JP | 61-14195 | 1/1986 |
| WO | WO 01/022776 | * 3/2001 |

OTHER PUBLICATIONS

Handbook of Polymer Coatings for Electronics, eds: J.J.Licari and L.A.Hughes, Noyes, (1990),□□pp. 73–84 and pp. 150–195.*

Union Carbide; Parylene Environmentally Compatible Conformal Coatings.

*Primary Examiner*—Mark F. Huff
*Assistant Examiner*—Kripa Sagar
(74) *Attorney, Agent, or Firm*—Stetina Brunda Garred & Brucker

(57) ABSTRACT

A method for preparing thin supported films by vacuum is disclosed. The method results in a substrate with windows. The windows are cutout (etched) areas that are covered by a thin film. The method for creating the substrate with thin film covering requires: masking off one surface of the metal substrate with a maskant; placing the metal substrate under a vacuum; treating the unmasked surface by plasma etching; coating the treated surface with a film while still under vacuum; removing substrate from vacuum; remove the masking; treating the previously masked side with photo resist; exposing the side treated with photo resist to artwork of a desired pattern; exposing the substrate to a suitable solution; chemically etching in areas selectively exposed by the artwork; neutralizing the substrate; and removing the etched parts from the substrate.

11 Claims, 2 Drawing Sheets

U.S. PATENT DOCUMENTS

| | | | |
|---|---|---|---|
| 5,078,091 A | 1/1992 | Stewart | 118/719 |
| 5,128,515 A | 7/1992 | Tanaka | 219/390 |
| 5,167,718 A | 12/1992 | Stewart | 118/729 |
| 5,268,033 A | 12/1993 | Stewart | 118/719 |
| 5,488,833 A | 2/1996 | Stewart | 62/55.5 |
| 5,618,379 A * | 4/1997 | Armacost et al. | 216/37 |
| 6,033,582 A * | 3/2000 | Lee et al. | 204/192.32 |
| 6,086,773 A * | 7/2000 | Dufresne et al. | 216/48 |
| 6,345,502 B1 * | 2/2002 | Tai et al. | 60/512 |

\* cited by examiner

METHOD OF PREPARING THIN SUPPORTED FILMS BY VACUUM DEPOSITION

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to milling metal and other suitable substrates and more particularly to a method of preparing thin supported films by vacuum deposition and chemical milling.

Chemically milling substrates is known in the art. For example, patterns can be chemically etched in metal substrates leaving holes in the shape of the pattern in the substrate. Many applications, such as laser beams, semiconductors and integrated circuits require that the holes in the substrate be covered with a thin film. Prior art systems use a two-step process to accomplish this. First, the substrate is etched, resulting in a substrate with one or more holes in the substrate. Second, a thin film is attached to one side of the substrate so that the thin film covers the holes. This process is problematic in that the thin film initially must be supported in some manner and then attached to the substrate. This process is prone to errors, such as damaging the film during the transferring and adhering process.

Therefore, a need exists for a system of producing an etched substrate with a thin film covering without having to transfer the thin film to the etched substrate.

BRIEF SUMMARY OF THE INVENTION

The present invention is directed to a method for preparing thin supported films by vacuum deposition. The method results in a substrate with a window or windows. The windows are cutout (etched) areas which are covered by a thin film. The method for creating the substrate with thin film covered areas requires: masking off one surface of the substrate with a maskant; placing the substrate under a vacuum; treating the unmasked surface by plasma etching to clean and enhance adhesion; coating the treated surface with a film while still under vacuum; removing the substrate from vacuum; removing masking; treating the previously masked side with photo resist; exposing the side treated with photo resist to artwork of a desired pattern; then exposing the substrate to a suitable solution; chemically etching in areas selectively exposed by the artwork and then neutralizing the substrate.

In accordance with other aspects of the invention, the substrate is a meta. The metal may be stainless steel, brass, silicon or other materials.

In accordance with still other aspects of the invention, the maskant can be tape, liquid film, wax, or other types of resists.

In accordance with yet other aspects of the invention the film is produced by vapor deposition or plasma arc deposition. Preferably, the film is parylene, or one of the many types of clear plastic films produced by low-pressure chemical or vapor deposition.

BRIEF DESCRIPTION OF THE DRAWINGS

These, as well as other features of the present invention, will become more apparent upon reference to the drawings wherein.

DETAILED DESCRIPTION OF THE INVENTION

The present invention is directed to a method of preparing thin supported films by vacuum deposition and chemical milling. The present invention is a one-step process in that the film is adhered to the metal prior to the etching process, thus eliminating the need to transfer the film to a pre-etched substrate.

Figure 1:
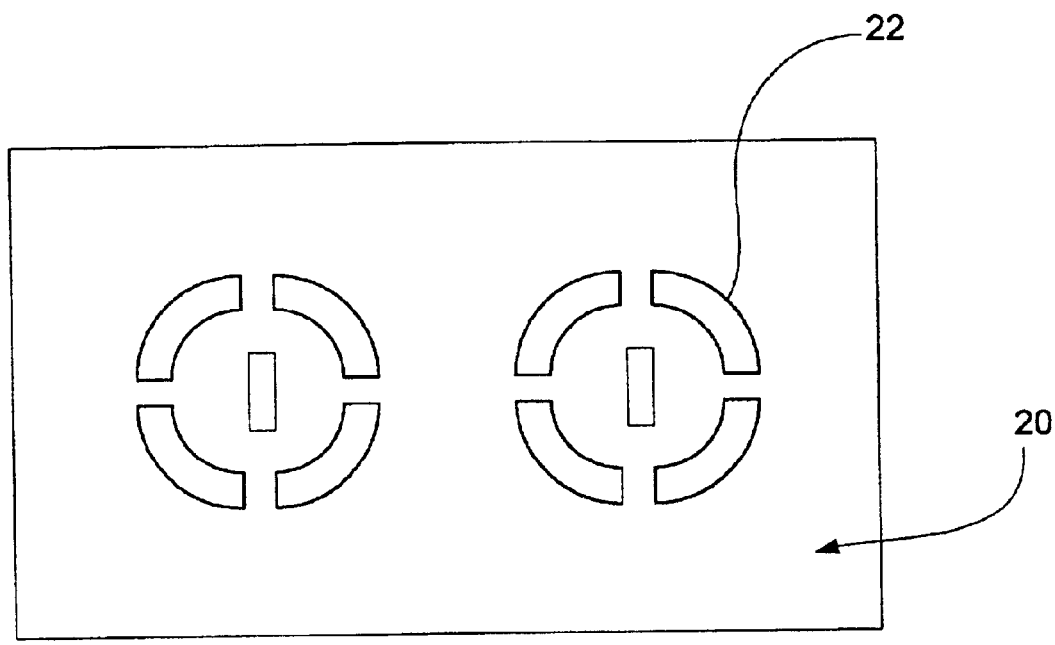
FIG. 1 is an exemplary illustration of a substrate with a thin film covering over an etched pattern formed in accordance with the present invention.

FIG. 1 illustrates an exemplary substrate 20, which has been prepared using the method of the present invention. In exemplary embodiments the substrate is a metal substrate, preferably manufactured from stainless steel. It will be appreciated that other metals may be suitable, for example, brass, silicon, or other. The substrate 20 is coated with a thin film, preferably parylene. A pattern 22 is then etched into the substrate 20. The etched portion is removed, leaving windows with the film in the etched portion. An exemplary method for creating the substrate with windows with film as shown in FIG. 1 is illustrated in FIG. 2 and described below.

Figure 2:
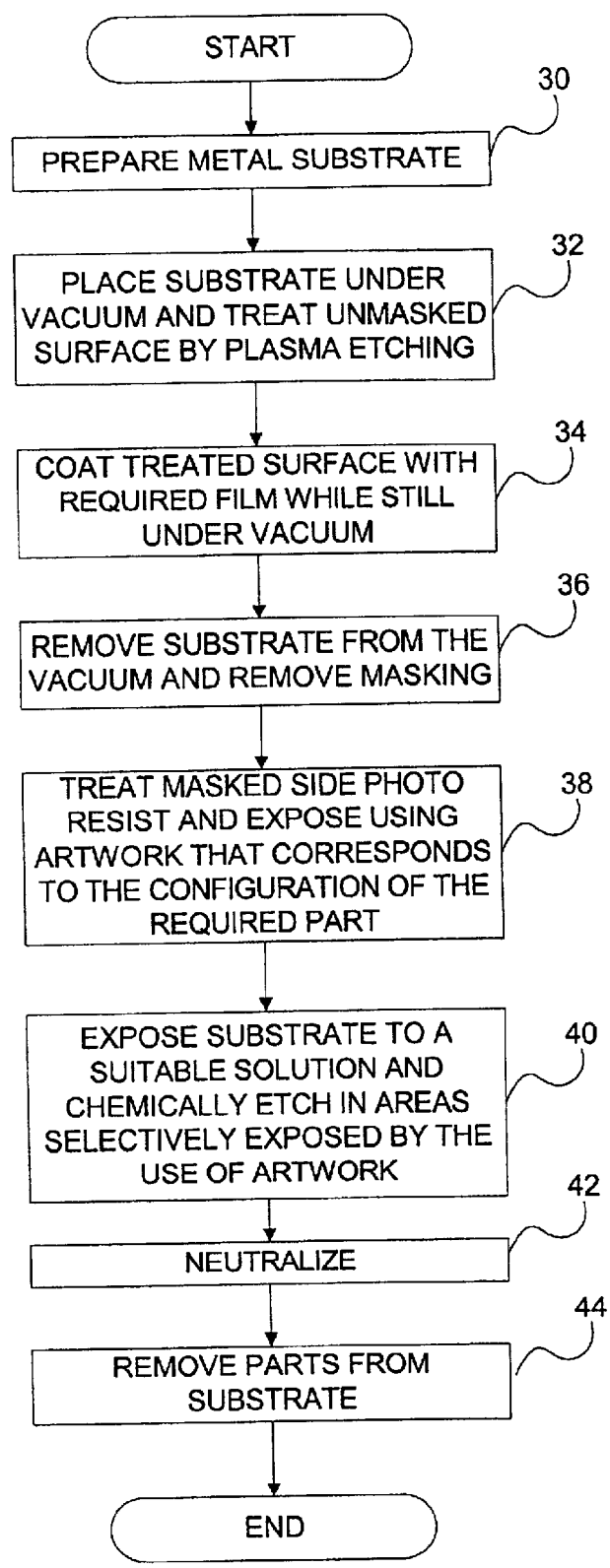
FIG. 2 is a flow diagram illustrating exemplary logic for creating a substrate with a thin film covering over an etched pattern such as the substrate shown in FIG. 1.

FIG. 2 is a flow diagram illustrating exemplary logic for a method of preparing thin supported films by vacuum deposition and chemical milling in accordance with the present invention. The logic moves from a start block to block 30 where the metal substrate is prepared.

Preferably, the substrate has a mirrored finish in order that defects in the substrate's surface will not be replicated in the finished film sheet. However, almost any substrate that can be chemically etched is suitable. The preparation of metal substrate 20 is accomplished by completely masking off one surface of the substrate with a suitable maskant, such as tape, liquid film, wax, or other types of resists. Next, in block 32, the substrate is placed under vacuum and treated on the exposed (unmasked) surface by plasma etching in order to improve adhesion. The plasma etching prepares the surface, thereby increasing the surface area, which improves adhesion. Preferably, the plasma etching is performed on the area that is going to be coated after the side being masked.

Next, in block 34, the treated surface is coated with the required film while still under vacuum. Preferably, the film is made from parylene. However, the film can be made from any chemically inert plastic material that can be deposited under vacuum (e.g., those produced by vapor deposition or plasma arc deposition). Preferably, the films are dielectric, however, dielectric films treated for conductivity may also be used. After deposition of the film, the substrate is removed from the vacuum and the masking is removed. See block 36. Next, in block 38, the side that has been masked is treated with photo resist and then exposed using the artwork that corresponds to the configuration of the required part. Next, in block 40, the substrate is exposed to a suitable solution such as acid, ferric chloride, etc. and chemically etched in the areas selectively exposed by use of the artwork in order to create a "window". After etching, the etching process is terminated by a suitable neutralizing step. See block 42. Finally, in block 44, the etched parts are removed (e.g., cut, sheared or detached) from the substrate.

Thus, the product of the process described above is the substrate with a cutout pattern which is covered by a thin film (e.g., parylene). Such a product can be used for various applications. For example, making windows of optically suitable films for use in x-ray systems, lasers, etc. The windows (film) can be made very thin, for example having a thickness of one micron or less. The product produced by the process used above can be used in systems that have a pressure differential across the window. Other applications include pellicles for use in optical systems as beam splitters and filters, etc.

Additional modifications and improvements of the present invention may also be apparent to those of the ordinary skill in the art. Thus, the particular parts described and illustrated herein are intended to represent only one embodiment of the present invention, and is not intended to serve as limitations of alternative devices within the spirit and scope of the invention.

What is claimed is:

1. A method for preparing a thin supported film on a metal substrate having two opposing surfaces, the method comprising:
   a. masking off a first surface of the metal substrate with a maskant, leaving a second surface of the metal substrate unmasked;
   b. placing the metal substrate under a vacuum;
   c. treating the unmasked second surface of the metal substrate by plasma etching;
   d. coating the treated second surface of the metal substrate by plasma etching;
   d. coating the treated second surface of the metal substrate with a film while still under vacuum;
   e. removing the metal substrate from the vacuum;
   f. removing the maskant from the first surface after the treated second surface is coated with the film;
   g. forming a photoresist on the first surface from which the maskant is removed, the photoresist exposing a part of the first surface of the photoresist;
   h. etching through the part of the substrate of which the first surface is exposed by the photoresist; and
   i. removing the photoresist.

2. The method of claim 1, wherein the metal substrate is a stainless steel substrate.

3. The method of claim 1, wherein the metal substrate is a brass substrate.

4. The method of claim 1, wherein the metal substrate is a silicon substrate.

5. The method of claim 1, wherein the maskant is a tape.

6. The method of claim 1, wherein the maskant is made from liquid film.

7. The method of claim 1, wherein the maskant is resist.

8. The method of claim 1, wherein the maskant is wax.

9. The method of claim 1, wherein the thin supported film is produced by plasma arc deposition.

10. The method of claim 1, wherein the thin supported film is produced by vapor deposition.

11. The method of claim 1, wherein the thin supported film is parylene.

* * * * *